US012733410B2

(12) United States Patent
Buzi et al.

(10) Patent No.: US 12,733,410 B2
(45) Date of Patent: Sep. 8, 2026

(54) HYDROGEN AND HYDROCARBON PLASMA TREATMENT OF PHASE CHANGE MEMORY MATERIAL

(71) Applicant: International Business Machines Corporation, Armonk, NY (US)

(72) Inventors: Luxherta Buzi, Chappaqua, NY (US); Robert L. Bruce, White Plains, NY (US); John M. Papalia, New York, NY (US); Lynne Marie Gignac, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 297 days.

(21) Appl. No.: 17/948,990

(22) Filed: Sep. 20, 2022

(65) Prior Publication Data

US 2024/0099163 A1 Mar. 21, 2024

(51) Int. Cl.

| | |
|---|---|
| ***H10N 70/20*** | (2023.01) |
| ***H10B 63/00*** | (2023.01) |
| ***H10N 70/00*** | (2023.01) |

(52) U.S. Cl.

CPC ........... *H10N 70/231* (2023.02); *H10B 63/24* (2023.02); *H10B 63/84* (2023.02); *H10N 70/021* (2023.02); *H10N 70/063* (2023.02); *H10N 70/841* (2023.02); *H10N 70/8828* (2023.02)

(58) Field of Classification Search

CPC ...... H10B 63/24; H10B 63/84; H10N 70/826; H10N 70/841; H10N 70/8828

See application file for complete search history.

(56) References Cited

U.S. PATENT DOCUMENTS

| | | | |
|---|---|---|---|
| 7,220,665 | B2 | 5/2007 | Farrar |
| 8,039,297 | B2 | 10/2011 | Kim et al. |
| 8,865,558 | B2 | 10/2014 | Park et al. |
| 8,921,822 | B2 | 12/2014 | Kim |
| 9,093,641 | B2 | 7/2015 | Liu et al. |

(Continued)

OTHER PUBLICATIONS

M. Shen et al., "Review on recent progress in patterning phase change materials," Journal of Vacuum Science and Technology A: Vacuum, Surfaces, and Films, vol. 38, No. 6, Sep. 2020, 06080 (17 pages).

(Continued)

*Primary Examiner* — Mark V Prenty
(74) *Attorney, Agent, or Firm* — L. Jeffrey Kelly

(57) ABSTRACT

Techniques for sidewall passivation and removal of redeposited materials and processing damage from phase change memory materials are provided. In one aspect, a phase change memory device includes: one or more phase change memory cells, where each of the phase change memory cells includes a phase change material between a bottom electrode and a top electrode; and a carbon and oxygen-containing passivation layer on sidewalls of the phase change material. An ovonic threshold switch can also be present between the bottom and top electrodes, in series with the phase change material, and the carbon and oxygen-containing passivation layer can also be present on sidewalls of the ovonic threshold switch. A method of fabricating the present phase change memory devices is also provided.

14 Claims, 6 Drawing Sheets

(56) References Cited

U.S. PATENT DOCUMENTS

| | | | | |
|---|---|---|---|---|
| 11,616,197 | B2 * | 3/2023 | Lee | H10N 70/8828 257/4 |
| 2010/0213431 | A1 | 8/2010 | Yeh et al. | |

OTHER PUBLICATIONS

Tsai et al., "Recent Progress in analog memory-based accelerators for deep learning," J. Phys. D: Appl. Phys. 51 (2018) (28 pages).

J.S. Washington et al., "Characterizing the effects of etch-induced material modification on the crystallization properties of nitrogen doped Ge2Sb2Te5," Journal of Applied Physics 109, 034502 (Feb. 2011) (7 pages).

S. Ambrogio et al., "Equivalent-accuracy accelerated neural-network training using analogue memory," Nature, vol. 558 (Jun. 2018) (22 pages).

* cited by examiner

HYDROGEN AND HYDROCARBON PLASMA TREATMENT OF PHASE CHANGE MEMORY MATERIAL

FIELD OF THE INVENTION

The present invention relates to phase change memory devices, and more particularly, to techniques for sidewall passivation and removal of redeposited materials and processing damage by hydrogen/hydrocarbon plasma treatment for improved phase change memory materials.

BACKGROUND OF THE INVENTION

A resistive processing unit or RPU stores information based on the resistance of the RPU. For instance, during programming, a SET operation is used to program the RPU to a low-resistance state representing a data value such as a logic '1' or a logic '0'. A subsequent RESET operation is then used to return the RPU to its previous high-resistance state.

A phase change material is a type of material that can be switched from one phase to another. Based on the properties of the different phases, phase change materials are ideal for use as the switching material in RPU-based phase change memory devices. Specifically, phase change materials provide a relatively high resistance when in an amorphous phase, and a relatively low resistance when in a crystalline phase.

However, phase change memory materials can be sensitive to air exposure and/or damage experienced during production. As such, additional processing steps are often needed to remediate these effects. For instance, a cleaning step can be implemented in the production queue to remove residue and damage from the sidewall of the phase change memory material. Doing so, however, requires that all downstream processes await this cleaning step, which can greatly impact production yield.

One can forego the cleaning step if patterning of the phase change memory is performed in-situ with a subsequent encapsulation. Doing so helps to avoid air exposure. However, the residue and damage remain on the phase change material, thereby impacting device performance.

Thus, techniques for efficiently and effectively removing residue and damage from a phase change memory material while, at the same time, forming a protective layer against air exposure would be desirable.

SUMMARY OF THE INVENTION

The present invention provides techniques for sidewall passivation and the removal of redeposited materials and processing damage by hydrogen/hydrocarbon plasma treatment for improved phase change memory materials. In one aspect of the invention, a phase change memory device is provided. The phase change memory device includes: one or more phase change memory cells, where each of the phase change memory cells includes a phase change material between a bottom electrode and a top electrode; and a carbon and oxygen-containing passivation layer on sidewalls of the phase change material.

In another aspect of the invention, another phase change memory device is provided. The phase change memory device includes: one or more phase change memory cells, where each of the phase change memory cells includes a phase change material and an ovonic threshold switch between a bottom electrode and a top electrode, where the ovonic threshold switch is in series with the phase change material; and a carbon and oxygen-containing passivation layer on sidewalls of the phase change material and on sidewalls of the ovonic threshold switch.

In yet another aspect of the invention, a method of fabricating a phase change memory device is provided. The method includes: forming a phase change memory device stack on a substrate, the phase change memory device stack including a phase change material and an ovonic threshold switch; patterning the phase change memory device stack into one or more phase change memory cells; and contacting the phase change memory cells with a hydrogen and hydrocarbon-containing plasma under conditions sufficient to form a carbon and oxygen-containing passivation layer on sidewalls of the phase change material and on sidewalls of the ovonic threshold switch.

A more complete understanding of the present invention, as well as further features and advantages of the present invention, will be obtained by reference to the following detailed description and drawings.

DETAILED DESCRIPTION OF PREFERRED EMBODIMENTS

As provided above, phase change memory materials can be sensitive to air exposure and/or damage experienced during production. For instance, the oxidation of exposed phase change memory materials can undesirably lead to changes in its crystallization temperature and composition, both of which impact the switching behavior of the phase change material. Further, the etching processes used during fabrication of the phase change memory device can damage the sidewall of the phase change material and/or can cause the materials being etched to become redeposited on the sidewall. Damage and residue along the sidewall also can impact the switching behavior of the phase change material.

Provided herein is a unique hydrogen/hydrocarbon plasma treatment for phase change memory materials that efficiently and effectively removes sidewall damage and residue, and advantageously creates a thin carbon and oxygen-containing (C—O) passivation layer on the surface of the phase change material sidewall. This passivation layer protects the phase change material from air exposure, thereby improving the switching performance (cycling endurance) of the phase change memory.

Figure 1:
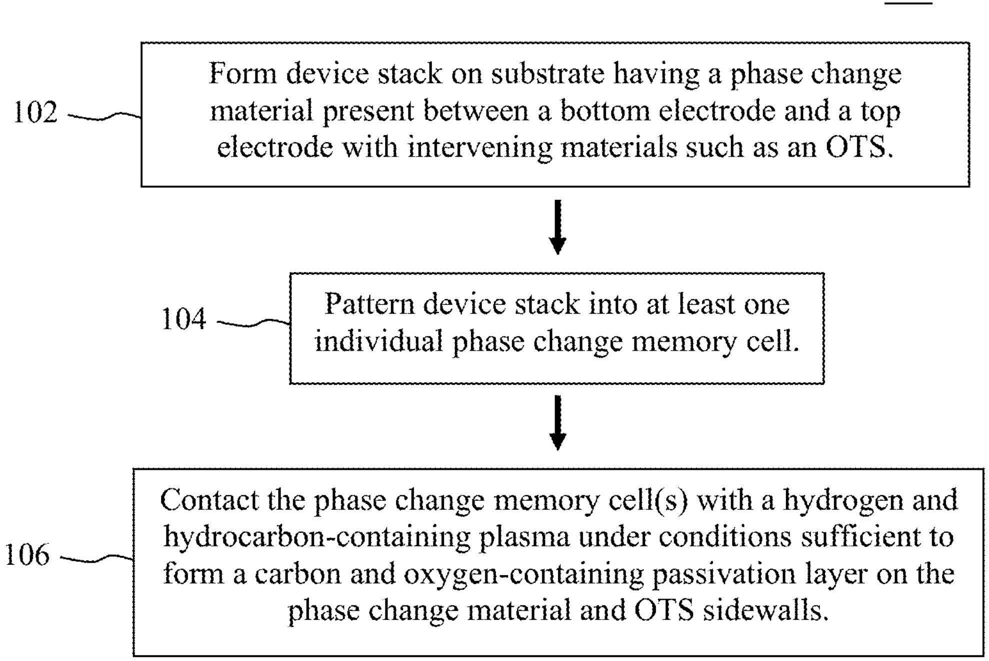
FIG. 1 is a diagram illustrating an exemplary methodology for fabricating a phase change memory device according to an embodiment of the present invention.

Referring to methodology 100 shown in FIG. 1, the present techniques for fabricating a phase change memory device in accordance with the present techniques involve first forming a phase change memory device stack on a substrate (see step 102). The phase change memory device stack includes a phase change material sandwiched between a bottom electrode and a top electrode, with other intervening materials such as an ovonic threshold switch (OTS) (see below).

According to an exemplary embodiment, the substrate is a bulk semiconductor wafer, such as a bulk silicon (Si), bulk germanium (Ge), bulk silicon germanium (SiGe) and/or bulk III-V semiconductor wafer. Alternatively, the substrate can be a semiconductor-on-insulator (SOI) wafer. An SOI wafer includes an SOI layer separated from an underlying substrate by a buried insulator. When the buried insulator is an oxide, it is also referred to herein as a 'buried oxide' or 'BOX.' The SOI layer can include any suitable semiconductor material(s), such as Si, Ge, SiGe and/or a III-V semiconductor. Further, the substrate may already have pre-built structures such as transistors, diodes, capacitors, resistors, interconnects, wiring, etc.

A wide variety of materials can be employed as the phase change material in accordance with the present techniques. In the sense that it can exist in amorphous and crystalline form, almost any material is a phase change material, including metals, semiconductors or insulators. However, only a small group of materials has the properties that makes them technologically useful phase change materials, such as a high on/off resistance ratio, fast switching times and good data retention. Many technologically relevant phase change materials are chalcogenides, meaning that they contain one or more chalcogenide elements. Chalcogenide elements are those elements in Group 16 of the periodic table, e.g., sulfur (S), selenium (Se) and/or tellurium (Te).

Thus, according to one exemplary embodiment, the present phase change material is a chalcogenide alloy and, more particularly, a chalcogenide alloy that includes the chalcogenide element Te in addition to other elements such as antimony (Sb) and/or germanium (Ge), forming the alloys $Sb_2Te_3$, GeTe, and/or $Ge_2Sb_2Te_5$ ('GST 225' or simply 'GST'). It is notable, however, that other technologically relevant materials are also contemplated herein for use as the present phase change material that are not chalcogenides, such as but not limited to, III-V semiconductor materials (such as gallium antimonide (GaSb)) and/or Ge—Sb based alloys. Further, additional elements such as silver (Ag), indium (In), nitrogen (N), silicon (Si) and/or bismuth (Bi) can be added to any of the above phase change materials to optimize their properties.

As described above, the present phase change material can be switched between two states, a poly-crystalline (or single-crystal) state and an amorphous state. In the poly-crystalline state, each grain of the present phase change material is a perfect crystal and the phase change material is conductive (almost metallic). It is notable, however, that each of the grains is randomly oriented with respect to the other grains resulting in an overall poly-crystalline material. In the amorphous state, there is no order in the material and the phase change material is highly resistive. These two states make the present phase change materials particularly well-suited for storing data.

According to an exemplary embodiment, an OTS is also present in the phase change memory device stack alongside the phase change material. Suitable OTS materials include, but are not limited to, arsenic selenium germanium silicon (AsSeGeSi), arsenic selenium germanium silicon carbide (AsSeGeSiC), arsenic selenium germanium silicon nitride (AsSeGeSiN), arsenic selenium germanium silicon tellurium (AsSeGeSiTe), arsenic selenium germanium silicon tellurium sulfide (AsSeGeSiTeS), arsenic tellurium germanium silicon (AsTeGeSi) and/or arsenic tellurium germanium silicon nitride (AsTeGeSiN).

In step 104, the phase change memory device stack is then patterned into at least one individual phase change memory cell. However, the etching processes (such as reactive ion etching) used to pattern the phase change memory device stack can cause surface damage or near surface damage along the sidewalls of the phase change material due to ion bombardment, contamination and/or stoichiometric modifications. Such surface damage can degrade electrical performance.

Further, the etched materials in the phase change memory device stack can undesirably become redeposited along the sidewalls of the phase change material. For instance, as will be described in detail below, the OTS can be located below the phase change material in the phase change memory device stack. Thus, during (top-down) patterning of the phase change memory device stack into the phase change memory cell(s), the phase change material is etched first, followed by the OTS. Residue from the OTS etch (including chalcogens like S, Se and/or Te) can then become redeposited on the sidewalls of the (already-patterned) phase change material. Redeposition of materials can undesirably change the stoichiometry of the phase change material, therefore leading to material property alterations. For instance, by way of example only, redeposited Se tends to segregate during device operation and cause voltage drifts.

Also, once patterned, the phase change material is exposed to air, leading to oxidation of the sidewalls of the phase change material. This oxidation alters the phase change material. For instance, oxidation can undesirably impact the crystallization temperature and/or composition of the phase change material. Both of these characteristics, i.e., crystallization temperature and composition, can impact the switching behavior of the phase change material.

Advantageously, in accordance with the present techniques, in step 106 the patterned phase change memory cell(s) is/are next contacted with a hydrogen and hydrocarbon-containing (hydrogen/hydrocarbon-containing) plasma under conditions (duration, flow rate, etc.) sufficient to form a thin carbon and oxygen-containing (carbon-oxygen) passivation layer on the exposed surfaces of the phase change memory cell(s), such as the sidewalls of the phase change material and the OTS. The term 'passivation layer' as used herein refers generally to any outer layer of a material that is applied as a protective coating. For instance, once formed, the present carbon and oxygen-containing passivation layer serves to encapsulate and protect the underlying phase change material and OTS from further air exposure, as well as from damage, residue, etc. that could result from subsequent downstream processing. Further, use of a hydrogen-containing plasma serves to reduce the existing damage on the patterned phase change material and OTS.

Preferably, the carbon and oxygen-containing passivation layer formed on the sidewalls of the phase change material and OTS in step 106 is thin. For instance, according to an exemplary embodiment, the carbon and oxygen-containing passivation layer has a thickness of less than about 30 nanometers (nm), e.g., the carbon and oxygen-containing passivation layer has a thickness of from about 2 nm to about 25 nm and ranges therebetween.

A plasma is a gas in which a significant percentage of the atoms or molecules are ionized. A plasma like the present hydrogen and hydrocarbon-containing plasma can be generated in a plasma chamber such as, but not limited to, an inductively coupled plasma chamber. In an inductively couple plasma chamber, the plasma source uses energy from electric currents that are produced by electromagnetic induction. As will be described in detail below, placing the phase change memory cell(s) in such a plasma chamber and generating the hydrogen and hydrocarbon-containing plasma within the plasma chamber from gaseous precursors will be used to form/deposit the carbon and oxygen-containing passivation layer on the sidewalls of the phase change material and OTS by a process often referred to as plasma-enhanced chemical vapor deposition or PECVD. PECVD generally involves the deposition of materials from a gas state to a solid state on a given substrate.

Figure 2:
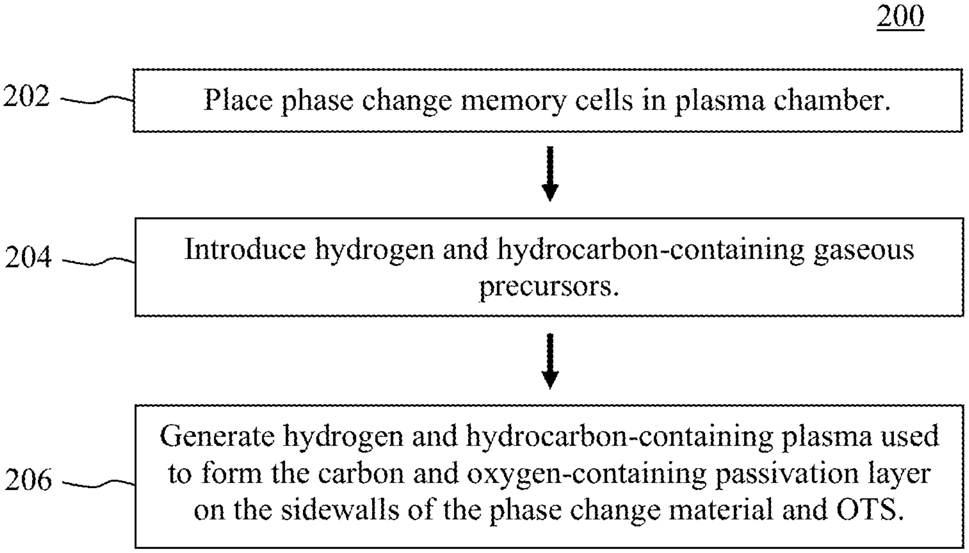
FIG. 2 is a diagram illustrating an exemplary methodology for forming a carbon and oxygen-containing passivation layer on sidewalls of the phase change memory material and ovonic threshold switch (OTS) according to an embodiment of the present invention.

For instance, methodology 200 of FIG. 2 illustrates a sequence of (sub) steps that can performed in carrying out step 106 of FIG. 1, in accordance with the present techniques. Namely, in step 202, the phase change memory cell(s) are placed in a plasma chamber such as an inductively coupled plasma chamber.

In step 204, hydrogen ($H_2$) and hydrocarbon-containing gaseous precursors, optionally along with a carrier gas, are then introduced into the plasma chamber. According to an exemplary embodiment, the hydrogen and hydrocarbon-containing gaseous precursors/carrier gas are introduced to the plasma chamber for a duration of from about 2 seconds to about 20 seconds and ranges therebetween, with an $H_2$ gas flow rate of from about 50 standard cubic centimeters per minute (sccm) to about 80 sccm and ranges therebetween, a hydrocarbon gas flow rate of from about 5 sccm to about 10 sccm and ranges therebetween, and a carrier gas flow rate of from about 80 sccm to about 130 sccm and ranges therebetween. Suitable hydrocarbon gases include, but are not limited to, methane ($CH_4$) and/or ethylene ($C_2H_4$). A carrier gas is an inert gas used to carry samples. Suitable carrier gases include, but are not limited to, helium (He), nitrogen ($N_2$) and/or argon (Ar).

The hydrogen and hydrocarbon gas/plasma serves as the carbon source for formation of the present carbon and oxygen-containing passivation layer. The oxygen component, on the other hand, can be trapped from the ambient and/or garnered from the oxygen already bound to the exposed sidewall of the phase change material and OTS, thus advantageously reducing or eliminating any sidewall oxidation.

In step 206, the hydrogen and hydrocarbon-containing gaseous precursors are used to generate the present hydrogen and hydrocarbon-containing plasma within the plasma chamber using, e.g., electromagnetic induction in the case of an inductively coupled plasma chamber. Exposure of the phase change memory cell(s) to this hydrogen and hydrocarbon-containing plasma in the plasma chamber results in the formation of the carbon and oxygen-containing passivation layer on the sidewalls of the phase change material and the OTS.

Figure 3:
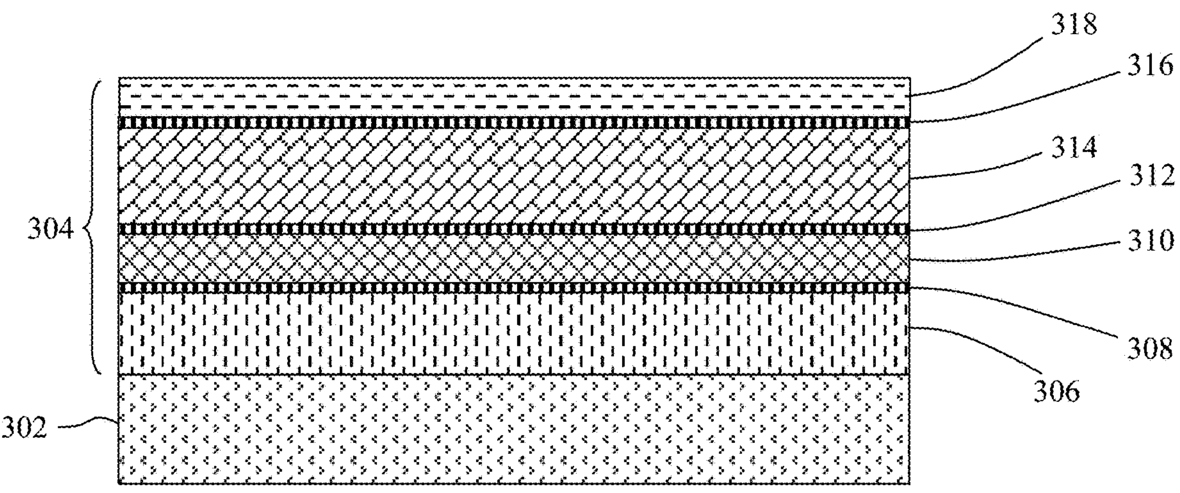
FIG. 3 is a cross-sectional diagram illustrating a phase change memory device stack having been formed on a substrate according to an embodiment of the present invention.
Figure 4:
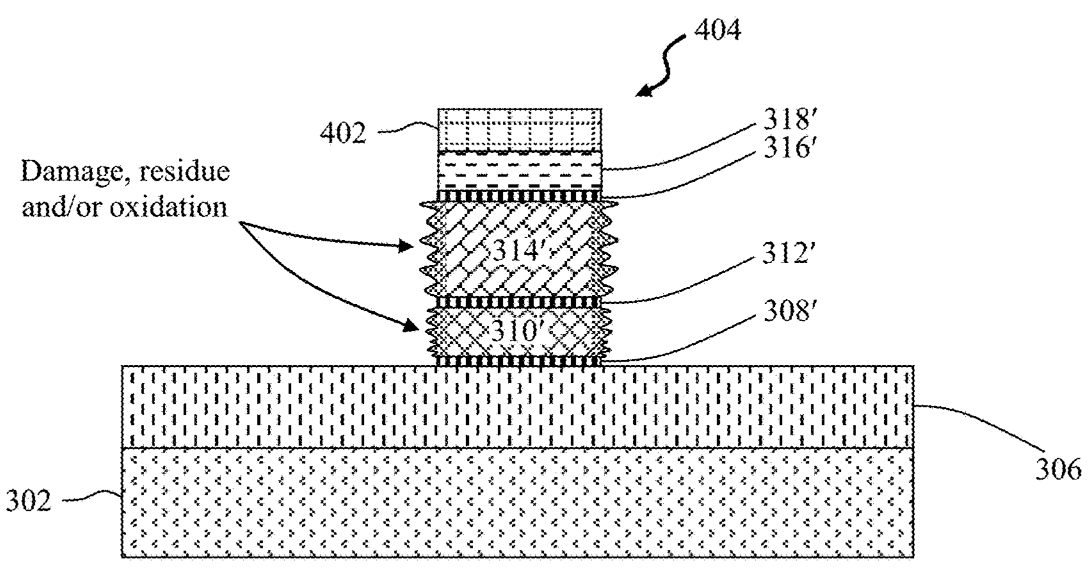
FIG. 4 is a cross-sectional diagram illustrating the phase change memory device stack having been patterned into at least one individual phase change memory cell according to an embodiment of the present invention.
Figure 5:
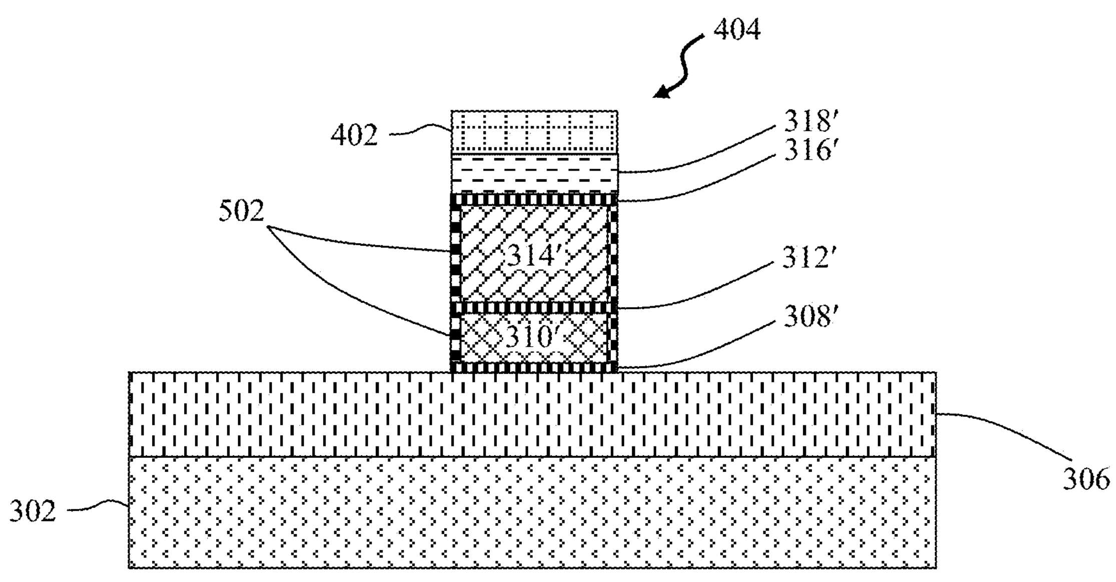
FIG. 5 is a cross-sectional diagram illustrating a carbon and oxygen-containing passivation layer having been formed on sidewalls of the phase change memory cell material and OTS according to an embodiment of the present invention.

Given the above overview, an exemplary implementation of methodology 100 of FIG. 1 and methodology 200 of FIG. 2 for the fabrication of a phase change memory device in accordance with the present techniques is now described by way of reference to FIGS. 3-5. As shown in FIG. 3, and as described in conjunction with the description of step 102 of FIG. 1, above, the process begins with the formation of a phase change memory device stack 304 on a substrate 302.

In the same manner as described above, substrate 302 can be a bulk semiconductor wafer, such as a bulk Si, bulk Ge, bulk SiGe and/or bulk III-V semiconductor wafer, or an SOI wafer with an SOI layer formed form a semiconductor material(s) such as Si, Ge, SiGe and/or a III-V semiconductor. Further, substrate 302 may already have pre-built structures (not shown) such as transistors, diodes, capacitors, resistors, interconnects, wiring, etc.

According to an exemplary embodiment, phase change memory device stack 304 includes a bottom electrode 306 disposed directly on the substrate 302, a (first) buffer layer 308 disposed directly on the bottom electrode 306, an OTS 310 disposed directly on the buffer layer 308, a (second) buffer layer 312 disposed directly on the OTS 310, a phase change material 314 disposed directly on the buffer layer 312, a (third) buffer layer 316 disposed directly on the phase change material 314, and a top electrode 318 disposed directly on the buffer layer 316.

It is notable, however, that the phase change memory device stack 304 configuration shown in FIG. 3 is merely being provided as an example for the purpose of illustrating the present techniques. In that regard, it is to be understood that the techniques described herein are more generally applicable to any phase change memory device having a phase change material and (optional) OTS with exposed sidewalls, and should not be construed as being limited to any particular phase change memory device configuration (s).

Suitable materials for the bottom electrode 306 include, but are not limited to, metals such as titanium (Ti), tantalum (Ta), cobalt (Co), ruthenium (Ru), tungsten (W) and/or aluminum (Al), metal nitrides such as titanium nitride (TiN), tantalum nitride (TaN), tungsten nitride (WN) and/or aluminum nitride (AlN) and/or a doped semiconductor such as doped Si, which can be deposited onto the substrate 302 using a process such as chemical vapor deposition (CVD), atomic layer deposition (ALD), physical vapor deposition (PVD), sputtering, evaporation, electrochemical plating, etc. According to an exemplary embodiment, the bottom electrode 306 has a thickness of from about 10 nm to about 50 nm and ranges therebetween.

Buffer layer 308 provides an etch stop for the later patterning of phase change memory device stack 304 (see below) and serves to prevent intermixing of the phase change memory device stack 304 materials. Suitable buffer layer 308 materials include, but are not limited to, carbon (C), silicon carbide (SiC), silicon (Si), tantalum (Ta), tantalum nitride (TaN), tantalum carbide (TaC), tungsten (W), tungsten nitride (WN), tungsten carbide (WC), titanium (Ti), titanium nitride (TiN) and/or titanium carbide (TiC), which can be deposited onto the bottom electrode 306 using a process such as CVD, ALD or PVD. According to an exemplary embodiment, buffer layer 308 has a thickness of from about 10 nm to about 30 nm and ranges therebetween. Further, while shown as a single layer, buffer layer 308 can optionally be composed of multiple layers, each layer containing at least one of the above-provided materials.

As will be described in detail below, the present phase change memory devices can be configured as an array of phase change memory cells arranged in a cross-point design between a plurality of first/second metal lines positioned above and below the phase change memory cells. With this cross-point array, one of the phase change memory cells is present at each intersection of the first and second metal lines. Implementation of an OTS in the phase change memory cells aids in the selection of an individual cell in the cross-point array. Namely, OTS 310 is placed in series with the phase change material 314 and acts as a switch that, with an applied current, switches from a highly resistive state to a conductive state. When the current is removed, OTS 310 returns to its highly resistive state.

As provided above, suitable OTS 310 materials include, but are not limited to, AsSeGeSi, AsSeGeSiC, AsSeGeSiN, AsSeGeSiTe, AsSeGeSiTeS, AsTeGeSi and/or AsTeGeSiN, which can be deposited onto buffer layer 308 using a process such as CVD, ALD or PVD. According to an exemplary embodiment, OTS 310 has a thickness of less than or equal to about 50 nm, e.g., from about 10 nm to about 45 nm and ranges therebetween.

Like buffer layer 308, buffer layer 312 acts as an etch stop and serves to prevent intermixing of the phase change memory device stack 304 materials. Suitable buffer layer 312 materials include, but are not limited to, C, SiC, Si, Ta, TaN, TaC, W, WN, WC, Ti, TiN and/or TiC, which can be deposited onto the OTS 310 using a process such as CVD, ALD or PVD. According to an exemplary embodiment, buffer layer 312 has a thickness of from about 10 nm to about 30 nm and ranges therebetween. Further, while shown as a single layer, buffer layer 312 can optionally be composed of multiple layers, each layer containing at least one of the above-provided materials.

As described above, a wide variety of materials can be employed as phase change material 314 in accordance with the present techniques. For instance, according to an exemplary embodiment, phase change material 314 is a chalcogenide alloy that includes the chalcogenide element Te, in combination with other elements such as Sb and/or Ge, e.g., $Sb_2Te_3$, GeTe, and/or $Ge_2Sb_2Te_5$. Alternatively, embodiments are also contemplated herein where phase change material 314 is a non-chalcogenide such as a GaSb and/or Ge—Sb based alloy. Yet further, embodiments are also contemplated herein where at least one of the above chalcogenide and/or non-chalcogenide phase change materials is doped with an additional element(s) such as Ag, In, N, Si and/or Bi to optimize its properties.

According to one exemplary embodiment, the phase change material 314 is deposited onto buffer layer 312 using a process such as PVD or CVD. Naturally, the specific targets (PVD) or precursors (CVD) for the deposition process depend on the particular phase change material being formed. For example, when physical vapor deposition (PVD) is used to deposit $Ge_2Sb_2Te_5$ the most common source is a $Ge_2Sb_2Te_5$ target. Alternatively, separate elemental Ge, Sb and Te targets can also be used by adjusting the flux from each target to obtain the desired composition. In another exemplary embodiment, molecular beam epitaxy is used to deposit $Ge_2Sb_2Te_5$. When molecular beam epitaxy is used, the sources may be individual Knudsen effusion cells. Namely, each cell contains one of the alloy elements (Ge, Sb or Te), and the flux of each element is controlled by the effusion cell temperature.

In one example, the deposition of phase change material 314 is performed at a high substrate temperature, for example, at a substrate temperature of from about 150 degrees Celsius (° C.) to about 300° C. and ranges therebetween. For instance, with $Ge_2Sb_2Te_5$ the preferred substrate temperature range is from about 175° C. to about 200° C. and ranges therebetween in order to produce the crystalline form of $Ge_2Sb_2Te_5$. Namely, by contrast, a room temperature deposition would generally yield an amorphous material when $Ge_2Sb_2Te_5$ is deposited. However, some phase change materials like $Sb_2Te_3$ would be crystalline even at deposition temperatures below 100° C. According to an exemplary embodiment, the phase change material 314 has a thickness of from about 5 nm to about 50 nm and ranges therebetween.

Like buffer layers 308 and 312 above, buffer layer 316 also acts as an etch stop and serves to prevent intermixing of the phase change memory device stack 304 materials. Suitable buffer layer 316 materials include, but are not limited to, C, SiC, Si, Ta, TaN, TaC, W, WN, WC, Ti, TiN and/or TiC, which can be deposited onto the phase change material 314 using a process such as CVD, ALD or PVD. According to an exemplary embodiment, buffer layer 316 has a thickness of from about 10 nm to about 30 nm and ranges therebetween. Further, while shown as a single layer, buffer layer 316 can optionally be composed of multiple layers, each layer containing at least one of the above-provided materials.

Suitable materials for the top electrode 318 include, but are not limited to, metals such as Ti, Ta, Co, Ru, W and/or Al, metal nitrides such as TiN, TaN, WN and/or AlN, and/or a doped semiconductor, which can be deposited onto the buffer layer 316 using a process such as CVD, ALD, PVD, sputtering, evaporation, electrochemical plating, etc. According to an exemplary embodiment, the top electrode 318 has a thickness of from about 5 nm to about 20 nm and ranges therebetween.

As shown in FIG. 4 and as described in conjunction with the description of step 104 of FIG. 1, above, the phase change memory device stack 304 is then patterned into at least one individual phase change memory cell 404. Standard lithography and etching techniques can be employed for the phase change memory device stack 304 etch. With standard lithography and etching techniques, a lithographic stack (not shown), e.g., photoresist/anti-reflective coating/organic planarizing layer, is used to pattern a hardmask 402 with the footprint and location of at least one individual phase change memory cell 404 in the phase change memory device stack 304. Alternatively, hardmask 402 can be formed by other techniques, including but not limited to, sidewall image transfer (SIT), self-aligned double patterning (SADP), self-aligned quadruple patterning (SAQP), and other self-aligned multiple patterning (SAMP). Suitable hardmask 402 materials include, but are not limited to, silicon nitride (SiN), silicon dioxide ($SiO_2$), titanium nitride (TiN) and/or silicon oxynitride (SiON). An etch is then performed to transfer the pattern from hardmask 402 to the underlying phase change memory device stack 304. A directional (i.e., anisotropic) etching process such as reactive ion etching can be employed for the phase change memory device stack 304 etch.

As shown in FIG. 4, the phase change memory device stack 304 is patterned down to the bottom electrode 306. Thus, each (patterned) phase change memory cell 404 includes the bottom electrode 306, a patterned portion of the buffer layer 308 (hereinafter given reference numeral 308'), a patterned portion of the OTS 310 (hereinafter given reference numeral 310'), a patterned portion of the buffer layer 312 (hereinafter given reference numeral 312'), a patterned portion of the phase change material 314 (hereinafter given reference numeral 314'), a patterned portion of the buffer layer 316 (hereinafter give reference numeral 316'), and a patterned portion of the top electrode 318 (hereinafter given reference numeral 318'). It is notable that the pattering of phase change memory device stack 304 can involves a series of reactive ion etching steps for which buffer layers 308, 312 and/or 316 can act as etch stops.

However, as shown in FIG. 4, the use of etching processes such as reactive ion etching to pattern the phase change memory device stack 304 can result in surface or near surface damage along the sidewalls of the phase change material 314' and OTS 310', which is the result of ion bombardment, contamination and/or stoichiometric modifications. Such surface damage can undesirably degrade electrical performance.

Further, as the etch progresses through the phase change memory device stack 304 from the top-down, residue from the patterning of structures farther down in the phase change memory device stack 304 can become redeposited onto the sidewalls of already-patterned portions. See FIG. 4. For instance, residue from the OTS 310' etch can become redeposited on the sidewalls of the (already-patterned) phase change material 314'. This OTS 310' residue can alter the composition of the phase change material 314', undesirably leading to changes in the switching behavior of the phase change material 314'.

Additionally, the patterning of phase change memory device stack 304 leaves the sidewalls of the phase change material 314' and OTS 310' exposed to oxygen. See FIG. 4. Oxidation of the phase change material 314' can undesirably lead to changes in its crystallization temperature and composition, both of which impact the switching behavior of the phase change material 314'. The same concerns exist with the oxidation OTS 310'.

In order to address these processing issues, a hydrogen and hydrocarbon-containing plasma treatment, as described in conjunction with the description of methodology 100 of FIG. 1 and methodology 200 of FIG. 2, is then used to form a carbon and oxygen-containing passivation layer 502 on the sidewalls of the phase change material 314' and OTS 310'. See FIG. 5. Advantageously, the hydrogen-containing plasma treatment serves to reduce the damage on the patterned phase change material 314' and OTS 310' and remove the residue. Further, as highlighted above, formation of the carbon and oxygen-containing passivation layer 502 uses oxygen that is already bound to the phase change material 314' and OTS 310' sidewalls. Thus, formation of the carbon and oxygen-containing passivation layer 502 can reduce or even eliminate oxidation of the phase change material 314' and OTS 310'. Once formed, the oxygen-containing passivation layer 502 protects the phase change material 314' and OTS 310' sidewalls from subsequent air exposure and oxidation, as well as from the contaminants created by any downstream processing.

According to an exemplary embodiment, the carbon and oxygen-containing passivation layer 502 formed in accordance with the present techniques will form on the sidewalls of at least the phase change material 314' and OTS 310'. See FIG. 5. Preferably, the carbon and oxygen-containing passivation layer 502 is thin. For example, in one embodiment, carbon and oxygen-containing passivation layer 502 has a thickness of less than about 30 nm, e.g., from about 2 nm to about 25 nm and ranges therebetween.

As described in detail above, carbon and oxygen-containing passivation layer 502 can be formed in accordance with the present techniques by contacting the phase change memory cell(s) 404 with a hydrogen and hydrocarbon-containing plasma. For instance, the phase change memory cell(s) 404 can be placed in a plasma chamber, such as an inductively coupled plasma chamber. Hydrogen ($H_2$) and hydrocarbon (e.g., $CH_4$ and/or $C_2H_4$)-containing gaseous precursors, optionally along with a carrier gas (e.g., He, $N_2$ and/or Ar), are then introduced into the plasma chamber. According to an exemplary embodiment, the hydrogen and hydrocarbon-containing gaseous precursors/carrier gas are introduced to the plasma chamber for a duration of from about 2 seconds to about 20 seconds and ranges therebetween, with an $H_2$ flow rate of from about 25 standard cubic centimeters per minute (sccm) to about 50 sccm and ranges therebetween, a hydrocarbon gas flow rate of from about 5 sccm to about 10 sccm and ranges therebetween, and a carrier gas flow rate of from about 100 sccm to about 130 sccm and ranges therebetween.

A hydrogen and hydrocarbon-containing plasma is then generated from these gaseous precursors in the plasma chamber using, e.g., electromagnetic induction in the case of an inductively coupled plasma chamber. Exposure of the phase change memory cell(s) to this hydrogen and hydrocarbon-containing plasma results in the formation of the carbon and oxygen-containing passivation layer 502 on the sidewalls of the phase change material 314' and OTS 310'.

Referring to FIG. 5, it can be seen that the present phase change memory cell 404 structure includes the phase change material 314' and OTS 310' between the bottom electrode 306 and the top electrode 318', with the OTS 310' in series with the phase change material 314'. Buffer layers 308', 312' and 316' are present below the OTS 310', between the OTS 310' and the phase change material 314', and above the phase change material 314', respectively.

Further, the carbon and oxygen-containing passivation layer 502 fully covers and protects the sidewalls of the phase change material 314' and OTS 310'. Namely, as shown in FIG. 5 the carbon and oxygen-containing passivation layer 502 is continuous along the sidewalls of both the phase change material 314' and the OTS 310'. Note that FIG. 5 provides a cross-sectional view, and it is to be understood that the carbon and oxygen-containing passivation layer 502 fully surrounds each of the phase change material 314' and OTS 310'. As such, the phase change material 314' and OTS 310' are fully encapsulated and protected by the carbon and oxygen-containing passivation layer 502. Additionally, the bottom and top of the OTS 310' are covered/protected by buffer layers 308' and 312', respectively, whereas the bottom and top of the phase change material 314' are covered/protected by buffer layers 312' and 316', respectively.

Figure 6:
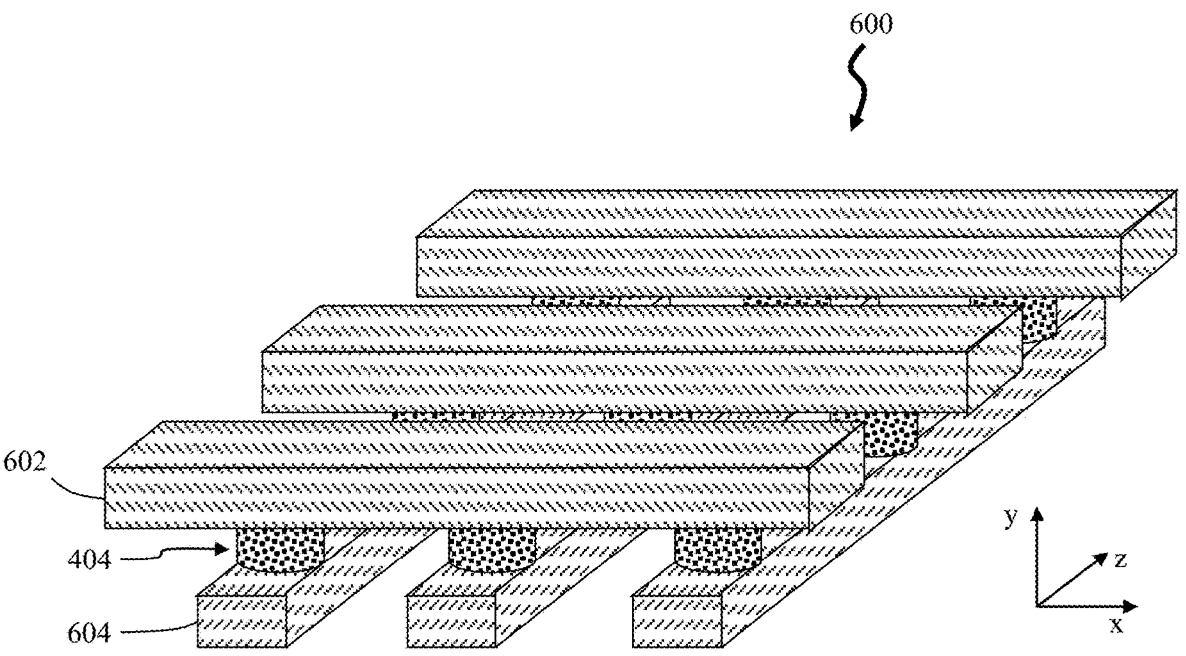
FIG. 6 is a diagram illustrating an exemplary configuration of the present phase change memory device as a cross-point array of phase change memory cells according to an embodiment of the present invention.

As provided above, one non-limiting configuration of the present phase change memory device contemplated herein is a cross-point array of the phase change memory cells 404. See, for example, the exemplary cross-point array 600 shown in FIG. 6. Cross-point array 600 includes multiple first metal lines 602 extending in a first x-direction, and multiple second metal lines 604 extending in a second z-direction, that is orthogonal to the first x-direction. As shown in FIG. 6, an array of the phase change memory cells 404 is located between the first metal lines 602 and the second metal lines 604 such that the first metal lines 602 are present above the phase change memory cells 404 and the second metal lines 604 are present below the phase change memory cells 404.

Specifically, the array of phase change memory cells 404 is arranged such that a single phase change memory cell 404 is present at the intersection of each given one of the first and second metal lines 602 and 604. Thus, each of the phase change memory cells 404 in cross-point array 600 can be uniquely accessed via the respective first and second metal lines 602 and 604 that run directly above and below that phase change memory cell 404. While not explicitly shown in FIG. 6, it is to be understood that each of the phase change memory cells 404 shown therein is configured as described above, and includes a phase change material 314' and an OTS 310' in series with the phase change material 314', a carbon and oxygen-containing passivation layer 502 on the sidewalls of the phase change material 314' and the OTS 310', buffer layers 308', 312' and 316' below the OTS 310', between the OTS 310' and the phase change material 314', and above the phase change material 314', respectively, etc.

Figure 7A:
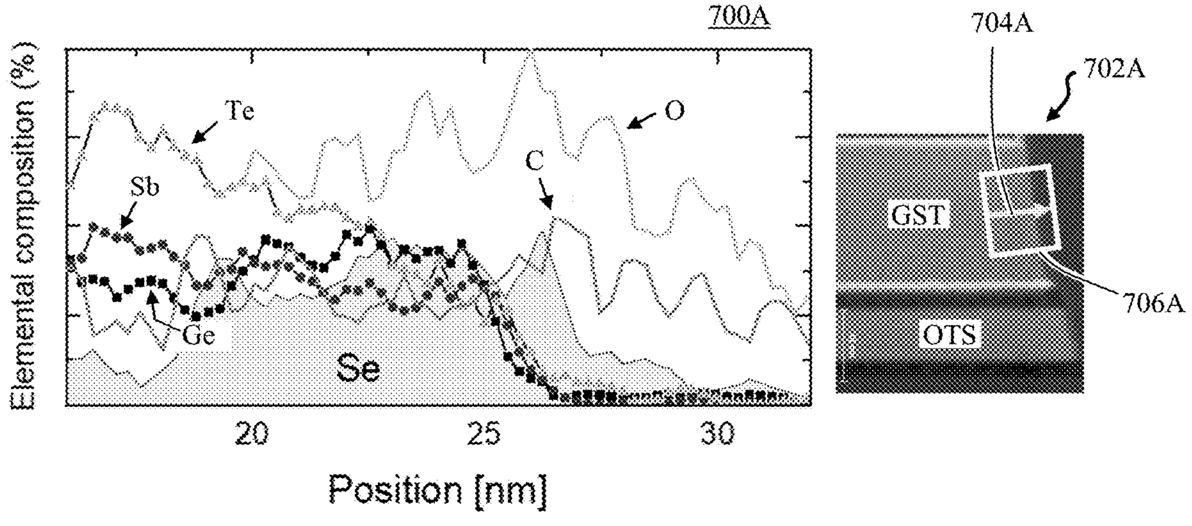
FIG. 7A is a data plot from elemental composition scans at the sidewall of a sample phase change memory material (GST) before treatment, as compared to FIG. 7B which is a data plot from elemental composition scans at the sidewall of the sample phase change memory material (GST) after the present hydrogen/hydrocarbon plasma treatment has been used to form a carbon and oxygen-containing passivation layer on the sidewalls of the phase change memory material according to an embodiment of the present invention.
Figure 7B:
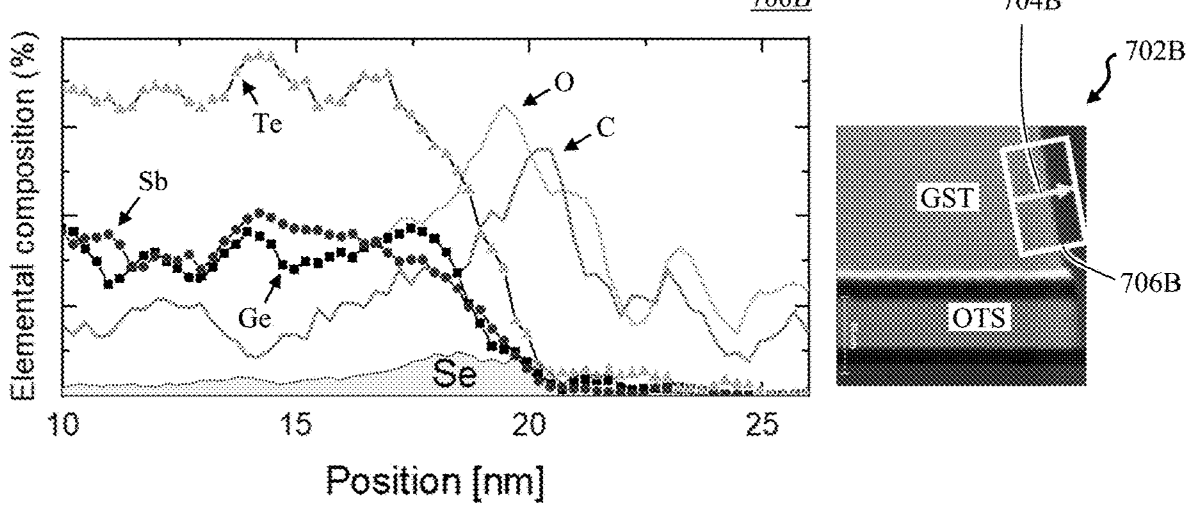

The present techniques are now further described by way of reference to the following non-limiting examples. For instance, plot 700A in FIG. 7A provides energy dispersive X-ray analysis (EDX) data which shows an elemental composition scan (oxygen (O), carbon (C), tellurium (Te), germanium (Ge) and selenium (Se)) at the sidewall (see arrow 704A and box 706A in inset 702A which shows the direction of the x-axis and sampled area, respectively) of a sample phase change memory material (GST) before treatment, as compared to plot 700B in FIG. 7B which provides EDX data showing an elemental composition scan (0, C, Te, Ge and Se) at the sidewall (see arrow 704B and box 706B in inset 702B which shows the direction of the x-axis and sampled area, respectively) of the sample phase change memory material (GST) after the present hydrogen/hydrocarbon plasma treatment has been used to form a carbon and oxygen-containing passivation layer on the sidewalls of the sample phase change memory material. Namely, by comparing FIG. 7A (before treatment) and FIG. 7B (after treatment), it can be seen that the present plasma treatment causes a flatter elemental profile of GST at the sidewall, reduces oxidation, removes redeposited materials from the layers below (such as Se from OTS—see shaded area beneath dotted curve labeled 'Se' in plots 700A and 700B) and a distinct carbon and oxygen-containing passivation layer at the sidewall.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A phase change memory device, comprising:

one or more phase change memory cells, wherein each of the one or more phase change memory cells comprises a phase change material between a bottom electrode and a top electrode; and a carbon and oxygen-containing passivation layer on sidewalls of the phase change material, wherein the carbon and oxygen-containing passivation layer has a thickness of less than about 30 nm.

2. The phase change memory device of claim 1, wherein the carbon and oxygen-containing passivation layer is continuous along the sidewalls of the phase change material, thereby fully encapsulating the phase change material.

3. The phase change memory device of claim 1, further comprising:

buffer layers at a bottom and a top of the phase change material.

4. The phase change memory device of claim 1, wherein the carbon and oxygen-containing passivation layer has a thickness of from about 2 nm to about 25 nm.

5. The phase change memory device of claim 1, wherein the phase change material is selected from the group consisting of: $Sb_2Te_3$, GeTe, $Ge_2Sb_2Te_5$, GaSb, Ge—Sb, and combinations thereof.

6. The phase change memory device of claim 1, wherein the one or more phase change memory cells are arranged in a cross-point array.

7. A phase change memory device, comprising:

one or more phase change memory cells, wherein each of the one or more phase change memory cells comprises a phase change material and an ovonic threshold switch between a bottom electrode and a top electrode, wherein the ovonic threshold switch is in series with the phase change material;

a carbon and oxygen-containing passivation layer on sidewalls of the phase change material and on sidewalls of the ovonic threshold switch;

a first buffer layer at a bottom of the ovonic threshold switch;

a second buffer layer at a top of the ovonic threshold switch and at a bottom of the phase change material; and a third buffer layer at a top of the phase change material.

8. The phase change memory device of claim 7, wherein the carbon and oxygen-containing passivation layer is continuous both along the sidewalls of the phase change material and along the sidewalls of the ovonic threshold switch, thereby fully encapsulating the phase change material and the ovonic threshold switch.

9. The phase change memory device of claim 7, wherein the first buffer layer, the second buffer layer, and the third buffer layer each comprises a material selected from the group consisting of: C, SiC, Si, Ta, TaN, TaC, W, WN, WC, Ti, TIN, TiC and combinations thereof.

10. The phase change memory device of claim 7, wherein the carbon and oxygen-containing passivation layer has a thickness of less than about 30 nm.

11. The phase change memory device of claim 7, wherein the carbon and oxygen-containing passivation layer has a thickness of from about 2 nm to about 25 nm.

12. The phase change memory device of claim 7, wherein the phase change material is selected from the group consisting of: $Sb_2Te_3$, GeTe, $Ge_2Sb_2Te_5$, GaSb, Ge—Sb, and combinations thereof.

13. The phase change memory device of claim 7, wherein the ovonic threshold switch comprises a material selected from the group consisting of: AsSeGeSi, AsSeGeSiC, AsSeGeSiN, AsSeGeSiTe, AsSeGeSiTeS, AsTeGeSi, AsTeGeSiN and combinations thereof.

14. The phase change memory device of claim 7, wherein the one or more phase change memory cells are arranged in a cross-point array.

* * * * *